US006622284B1

(12) United States Patent
Naffziger et al.

(10) Patent No.: US 6,622,284 B1
(45) Date of Patent: Sep. 16, 2003

(54) METHOD AND APPARATUS FOR DETECTION OF ERRORS IN ONE-HOT WORDS

(75) Inventors: Samuel D Naffziger, Ft Collins, CO (US); Kevin Lee Jones, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/465,723

(22) Filed: Dec. 17, 1999

(51) Int. Cl.$^7$ .................. G06F 11/00; H03M 13/51; H03M 13/00
(52) U.S. Cl. .................. 714/811; 714/806; 714/809
(58) Field of Search .................. 714/806, 809, 714/811; 326/113, 39; 341/160

(56) References Cited

U.S. PATENT DOCUMENTS

| | | | | |
|---|---|---|---|---|
| 4,498,177 A | * | 2/1985 | Larson .................. | 714/806 |
| 4,912,348 A | * | 3/1990 | Maki et al. .................. | 326/113 |
| 5,012,246 A | * | 4/1991 | Chung et al. .................. | 341/160 |
| 5,859,999 A | | 1/1999 | Morris et al. .................. | 395/565 |
| 5,860,017 A | | 1/1999 | Sharangpani et al. .. | 395/800.23 |
| 6,003,154 A | * | 12/1999 | Fisher .................. | 714/806 |
| 6,034,542 A | * | 3/2000 | Ridgeway .................. | 326/39 |
| 6,222,893 B1 | * | 4/2001 | Someya .................. | 375/355 |
| 6,346,906 B1 | * | 2/2002 | Nakaigawa .................. | 341/160 |

OTHER PUBLICATIONS

"Scan Synthesis for One–Hot Signals" by Mitra et al. International Test Conference Proceedings. Nov. 1–6, 1997 pp. 714–722.*
"Metamorphosis: State Assignment by Retiming and Re–encoding" by Iyer et al. Computer–Aided Design, 1996. ICCAD–96. Digest of Technical Papers., 1996 IEEE/ACM International Conference on, Nov. 10–14, 1996 pp. 614–617.*

*Primary Examiner*—Albert Decady
*Assistant Examiner*—Cynthia Britt

(57) ABSTRACT

Disclosed is an apparatus and method for detecting errors in one-hot words, which have only a single bit set in the absence of errors. The apparatus comprises a plurality of input signal lines, a plurality of switching devices, a plurality of intermediate signal lines, and logic circuitry. The switching devices are connected to the input signal lines. The intermediate signal lines are also connected to the switching devices. The connection is in such a way that when a particular input signal line is set, all intermediate signal lines connected by a switching device to that particular input signal line are forced to a predetermined logic state. The intermediate signal lines are input to the logic circuitry, which outputs a signal indicative of whether at least two of the plurality of input signal lines are set. The method detects non-one-hot conditions in a group of M bits. The method encodes the group of M bits into at least $2 \cdot \log_2 M$ encoded bits, such that each one-hot condition in the group of M bits generates a unique condition in the encoded bits. The method determines on the basis of the encoded bits whether the group of M bits are in a non-one-hot condition. In another respect, the method first partitions a group D of bits into two non-intersecting subsets NS0 and S0 such that D is the union of NS0 and S0. The method determines whether any of the bits in the subset NS0 are hot. The method also determines whether any of the bits in the subset S0 are hot. The group D is partitioned again into another two completely different non-intersecting subsets NS1 and S1 such that D is the union of NS1 and S1. The method then determines whether any of the bits in NS1 are hot and whether any of the bits in S1 are hot. On the basis of the determinations made so far, the method determines whether the group D contains at least two hot bits. The apparatus and method detect all non-one-hot words, is scalable, and can be implemented physically with a small propagation delay that is largely independent of the number of input signal lines or the size of the group D.

8 Claims, 6 Drawing Sheets

OTHER PUBLICATIONS

"Refined CPLD Macrocell Architecture for the Effective FSM Implementation" by Solovjev et al. EUROMICRO Conference, 1999. Proceedings. 25th , vol.: 1, 1999 pp. 102–109 vol. 1.*

"New Area Efficient Residue–to–Weighted Number System Converters" by Mathew et al. Electronics, Circuits and Systems, 1999. Proceedings of ICESS '99. The 6th IEEE International Conference on , vol.: 2. Sep. 5–8, 1999 pp. 945–948 vol.*

Delta–Sigma Modulator with Large OSR Using the One–Hot Residue Number System by Chren IEEE Transactions on Circuits and Systems—II;Analog and Digital Signal Processing, Vol 46, No. 8, Aug. 1999.*

Wolfe, A., "Patents shed light on Merced's Innards", Electronic Engineering Times, Feb. 15, 1999.

* cited by examiner

US 6,622,284 B1

METHOD AND APPARATUS FOR DETECTION OF ERRORS IN ONE-HOT WORDS

TECHNICAL FIELD

The invention relates to error detection. More particularly, the invention relates to methods and apparatus for efficiently detecting errors in one-hot words, which have only a single bit set in the absence of errors.

BACKGROUND ART

A binary one-hot word is a set of binary bits which have a single bit high and all others low, or a single bit low and all other bits high. For the sake of clarity, this document will refer to the single "hot" or "set" bit in a binary one-hot word as if it were nominally high while and all others are nominally low, even though it is equally possible that the set bit could be nominally low while all others are nominally high. One-hot words are utilized for example as the tag storage in a pre-validated cache. Other uses for one-hot words are apparent to those skilled in the art.

A one-hot word may be corrupted by errors in one or both of two ways generally. In a first form of corruption, the set bit is un-set (i.e., the single one bit is changed to zero). The result of this corruption is a word having all bits zero. As used herein, the term "miss" refers to this situation where all bits are zero. Depending upon the application, a miss may or may not be an erroneous condition. For example, a miss in a pre-validated cache is a valid, uncorrupted state, whereas in other applications, a miss is not valid. The other form of corruption of an one-hot word is the setting of one or more bits that should remain low. That is, a one-hot word so corrupted has two or more bits set. As used herein, the term "multihit" is used to refer to a word having two or more bits set, whereas the term "hit" is used to refer to a word having any one or more bit set.

FIG. 1 shows logic circuitry 100 for detecting certain types of errors in an eight bit one-hot word. The one-hot word has eight constituent bits D0, D1, . . . , D7, and the word is denoted D0:D7. The eight data bits D0, D1, . . . , D7 are input to the logic circuitry 100 from the left, as shown in FIG. 1. Exclusive-OR (XOR) gates 104, 108, 112, 116, 120, 124, and 128 are connected together so as to form an eight input exclusive-OR function. A signal ODD is output from the final exclusive-OR gate 128. The signal ODD is high if the number of bits set in the word D0:D7 is odd; the signal ODD is low if the number of bits set in the word D0:D7 is even.

The logic circuitry 100 also includes NOR gates 140, 144, 148, and 152 connected to NAND gates 156 and 160, which are connected to a NOR gate 164 in such a way that a signal MISS output from the NOR gate 164 is high if and only if every bit of the word D0:D7 is low. An inverter gate 170 is connected to the signal MISS, and a signal HIT is output from the inverter gate 170. The signal HIT is high if one or more of the bits in the word D0:D7 is high. The signals ODD and MISS are input into a NOR gate 174. The output of the NOR gate 174 is a signal EVEN MULTIHIT, which is high when exactly two or exactly four or exactly six or all eight of the data bits D0, D1, . . . , D7 are high. Thus, the logic circuit 100 is capable of detecting certain types of erroneous one-hot words. However, the logic circuit 100 is not capable of detecting all errors in the one-hot word D0:D7. In particular, the logic circuit 100 is not capable of detecting an error in which an odd number of bits is set in the word D0:D7. That is, the cases when exactly is three or exactly five or exactly seven bits in the word D0:D7 are not detected as one-hot errors by the logic circuit 100.

SUMMARY OF INVENTION

In one respect, the invention is an apparatus for use in detecting errors in one-hot words. The apparatus comprises a plurality of input signal lines, a plurality of switching devices connected to the input switch signal lines, a plurality of intermediate signal lines, and logic circuitry. The switching devices are connected to the input signal lines. The intermediate signal lines are also connected to the switching devices. The connection is in such a way that when a particular input signal line is set, all intermediate signal lines connected by a switching device to that particular input signal line are forced to a predetermined logic state. The intermediate signal lines are input to the logic circuitry, which outputs a signal indicative of whether at least two of the plurality of input signal lines are set.

In another respect, the invention is a method for detecting non-one-hot conditions in a group of M bits. The method encodes the group of M bits into at least $2 \cdot \log_2 M$ encoded bits, such that each one-hot condition in the group of N bits generates a unique condition in the group of encoded bits. The method determines on the basis of the encoded bits whether the group of M bits are in a non-one-hot condition. It is preferable but not mandatory, that the at least $2 \cdot \log_2 M$ encoded bits be two groups of at least $\log_2 M$ encoded bits each. For example (and not by way of limitation), the two groups of at least $\log_2 M$ encoded bits can be complement encodings of each other.

In yet another respect, the invention is a method for detecting one-hot errors in a group D of bits. The method first partitions the group D of bits into two non-intersecting subsets S0 and NS0 such that D is the union of S0 and NS0. The method determines whether any of the bits in the subset S0 are hot. The method also determines whether any of the bits in the subset NS0 are hot. The group D is partitioned again into another two completely different non-intersecting subsets S1 and NS1 such that D is the union of S1 and NS1. The method then determines whether any of the bits in S1 are hot and whether any of the bits in NS1 are hot. On the basis of the determinations made so far, the method determines whether the group D contains an error.

In comparison to the logic circuitry 100, certain embodiments of the invention are capable of achieving certain advantages, including the following:

(1) Detection of all non-one-hot words (i.e., all multihits whether even or odd as well as misses if applicable) is possible with certain embodiments of the invention.

(2) Certain embodiments of the invention are capable of processing a one-hot word for the purpose of detecting errors with less delay than the logic circuitry 100. In particular, there are seven gate delays in the logic circuit 100 going from the left side input to the right side output. (Gate delays are counted herein according to the typical convention in which XOR gates introduce two units of delay, while inverters or NAND gates introduce one unit of gate delay). Certain embodiments of the invention, on the other hand, have as little as four gate delays to do the same thing. Furthermore, the number of gate delays is largely independent of the size of (i.e., number of bits in) the one-hot word, whereas that is not the case with the logic circuitry 100.

(3) Certain embodiments of the invention can be physically implemented using less semiconductor area than the logic circuitry 100.

Those skilled in the art will appreciate these and other advantages and benefits of various embodiments of the invention upon reading the following detailed description of a preferred embodiment with reference to the below-listed drawings.

DETAILED DESCRIPTION OF A PREFERRED EMBODIMENT

Figure 1:
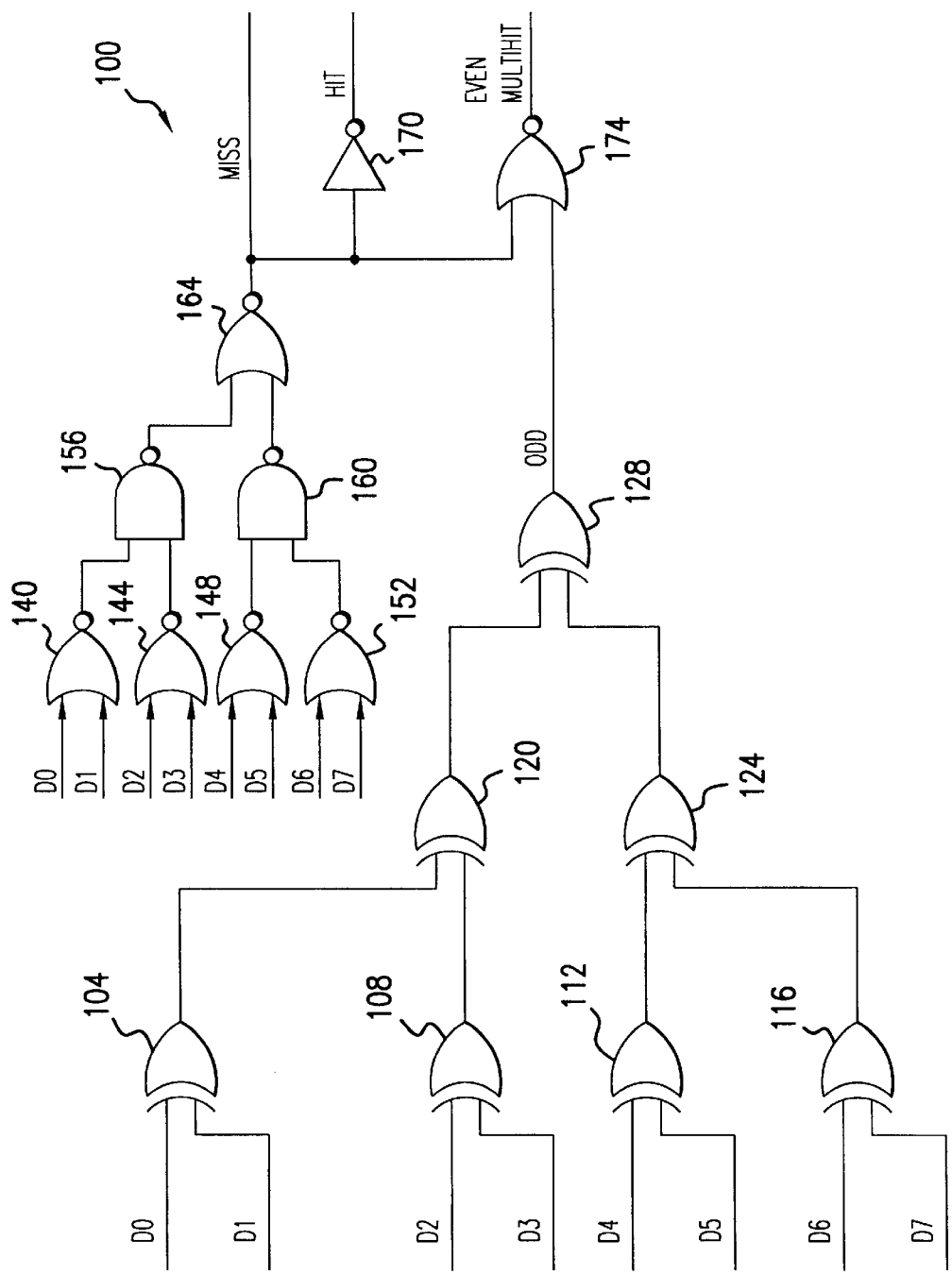
FIG. 1 is a logic diagram of circuitry for detecting parity errors.
Figure 2:
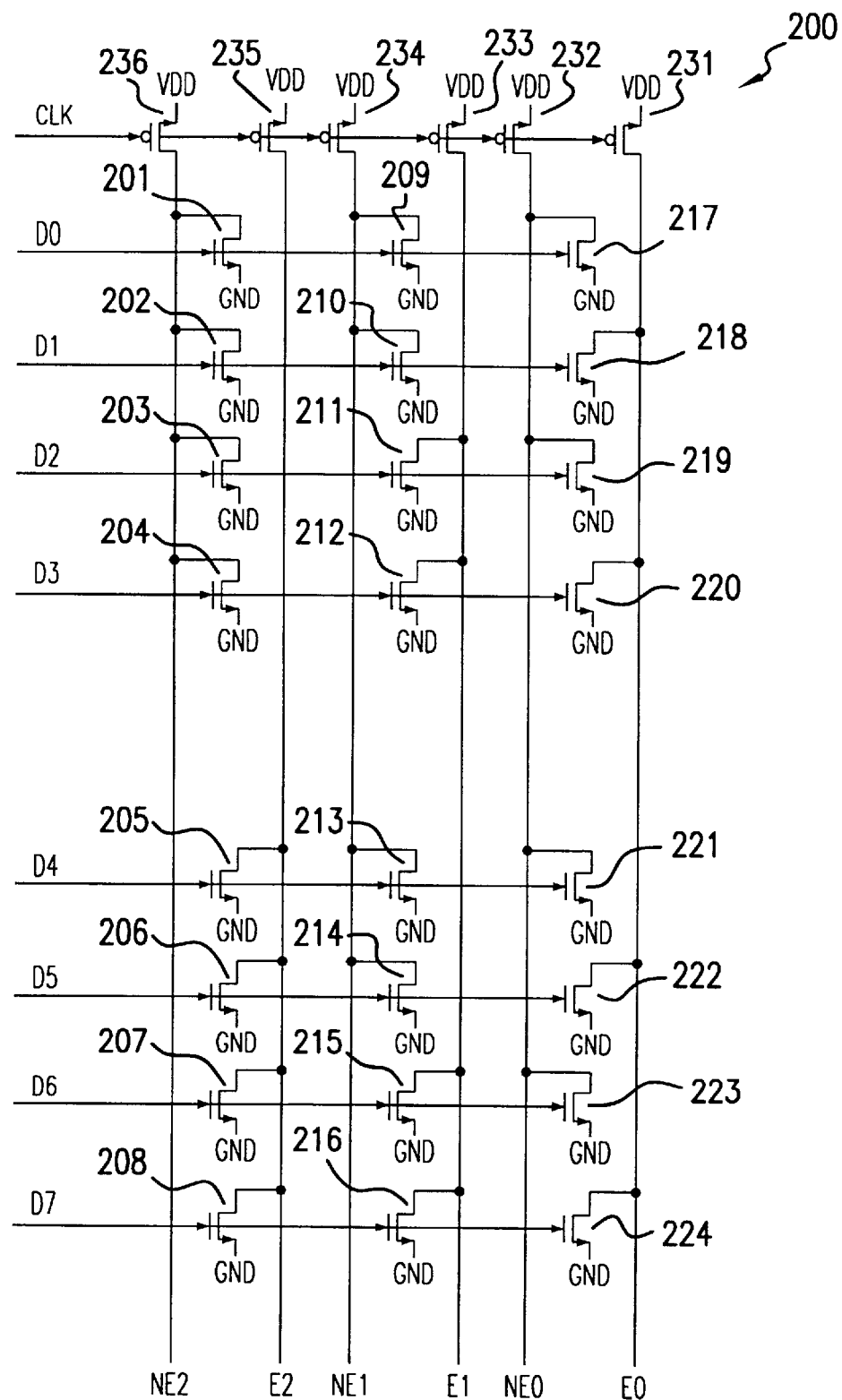
FIG. 2 is a schematic diagram of circuitry for use in detecting errors in one-hot words according to one embodiment of the invention.

FIG. 2 is a schematic diagram of circuitry 200 for use in detecting errors in one-hot words according to one embodiment of the invention. An eight bit word, nominally a one-hot word, D0:D7 is input to the circuitry 200 on eight input signal lines D0, D1, . . . , D7 shown horizontally in the figure. The input signal lines D0, D1, . . . , D7 are selectively connected to switching devices 201–224. Although the switching devices 201–224 are shown arranged in a rectangular array because that arrangement best illustrates the principles of the invention, the switching devices 201–224 can be arranged in any physical arrangement whatsoever. The switching devices 201–224 are preferably NFETs (N-channel field effect transistors). Each NFET 201–224 is connected to an input signal line at its gate terminal. Also connected to the NFETs 201–224 are several intermediate signal lines NE0, E0, NE1, E1, NE2 and E2, appearing vertically in FIG. 2. The intermediate signal lines NE0, E0, NE1, E1, NE2 and E2 are connected to selected switching devices 201–224 at the drain terminals of the switching devices 201–224. The source terminals of the switching devices 201–224 are connected to ground. The intermediate signal lines NE0, E0, NE1, E1, NE2 and E2 are also connected to PFETs (P-channel field effect transistors). For example, the intermediate signal line E0 is connected to a PFET 231 at its drain terminal. Likewise, the other intermediate signal lines NE0, E1, NE1, E2 and NE2 are connected to PFETs 232–236, respectively. Each of the PFETs 231–236 is connected at its gate terminal to a clock signal CLK. The PFETs 231–236, as so connected to the clock signal CLK, pre-charge the intermediate signal lines NE0, E0, NE1, E1, NE2 and E2. Thus, NE0=E0=NE1=E1=NE2=E2=1 nominally. However, the input signal lines D0:D7 cause connected switching devices to force connected intermediate signal lines to ground. That is, an intermediate signal line can be pulled low depending on the state of the data lines D0:D7 and their connections to the switching devices 201–224. As an example, consider the case when D0 is high, causing switching devices 201, 209 and 217 to conduct from source to drain (i.e., "turn on"), thus forcing to a low logical state the intermediate signal lines NE2, NE1, and NE0.

As can be seen from inspection of the circuitry 200, if any of D0, D1, D2 or D3 is set, then the intermediate signal line NE2 is pulled low. If any of D4, D5, D6 or D7 is set, then the intermediate signal line E2 is pulled low. Thus, NE2 and E2 are both low only if two or more bits are set in D0:D7, i.e., at least one bit in the upper half D0:D3 and at least one bit in lower half D4:D7. This is true because the intermediate signal line NE2 and E2 are connected to non-overlapping sets of the data bits via the switching devices 201–208. Similarly, the intermediate signal line NE1 and E1 are connected to non-overlapping sets of the data bits ({D0, D1, D4, D5} and {D2, D3, D6, D7} respectively) via the switching devices 209–216, and the intermediate signal line NE0 and E0 are connected to different non-overlapping sets of the data bits ({D0, D2, D4, D6} and {D1, D3, D5, D7} respectively) via the switching devices 217–224.

Figure 3:
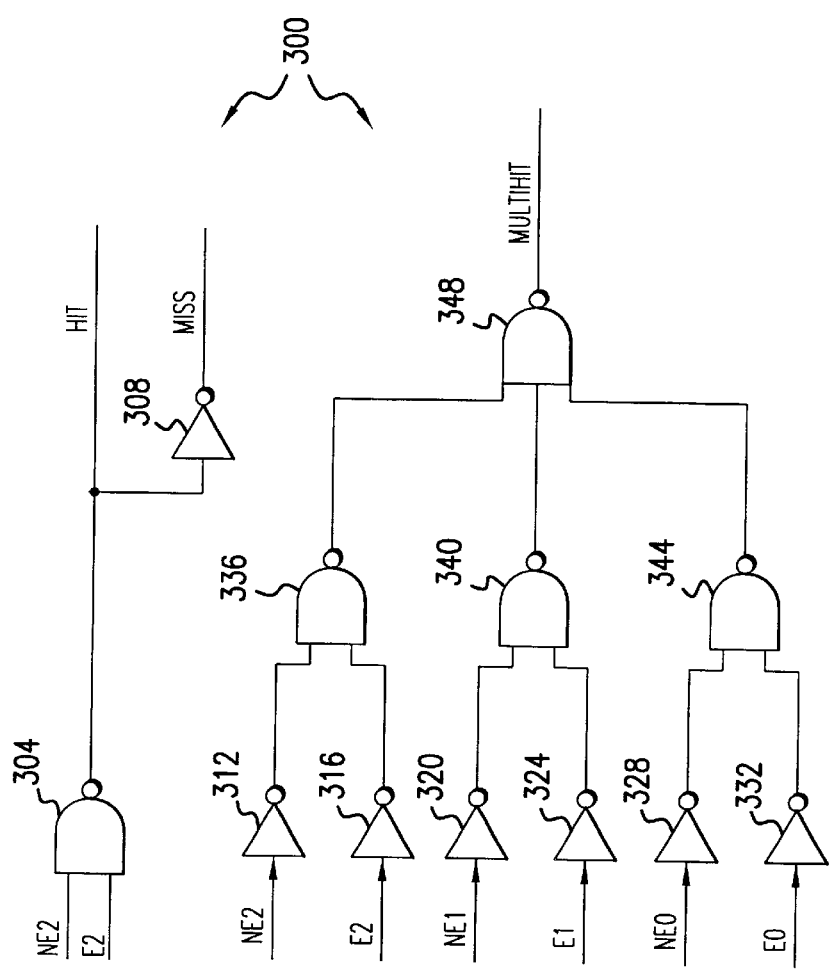
FIG. 3 is a diagram of logic circuitry for use in detecting errors in one-hot words according to one embodiment of the invention.

As shown in the logic circuitry 300 of FIG. 3, the intermediate signal lines NE2 and E2 are input into a NAND gate 304. The output of the NAND gate 304 is a signal HIT, which is high if either E2 or NE2 are low. A signal MISS is formed by an inverter 308 connected to the signal HIT. The signals HIT and MISS are exactly equivalent if E1 and NE1 replace E2 and NE2 in the logic circuitry 300. Likewise, the signals HIT and MISS are exactly equivalent if E0 and NE0 replace E2 and NE2 in the logic circuitry 300.

The intermediate signal lines NE2, E2, NE1, E1, NE0 and E0 are respectively input to inverter gates 312–332, which are connected to NAND gates 336–348. The output of the NAND gate 348 is a signal MULTIHIT, which is high if and only if two or more of D0:D7 are set. As can be seen, the signal MULTIHIT is high if one or more of three conditions is met. First, if both NE2 and E2 are low, meaning that at least one bit is set among D0:D3 and at least one bit is set among D4:D7, then the signal MULTIHIT is high. Second, if both NE1 and E1 are low, meaning that at least one of their connected data bits are high in both non-overlapping sets of bits {D0, D1, D4, D5} and {D2, D3, D6, D7}, then the signal MULTIHIT is high. Third, if both NE0 and E0 are low, meaning that at least one of their connected data bits are high in both non-overlapping sets of bits {D0, D2, D4, D6} and {D1, D3, D5, D7}, then the signal MULTIHIT is high. Thus, the circuit 200 encodes the eight data bits D0:D7 into three pairs of values in such a way that all pairs are different and one of each pair is non-intersecting with the other one of the pair. In this way, the occurrence of any two or more bit errors in D0:D7 is guaranteed to pull low both of at least one of the three pairs. That is, a multihit error in D0:D7 causes one or more of the following: (a) pull both NE0 and E0 low; and/or (b) pull both NE1 and E1 low; and/or (c) pull both NE2 and E2 low. The logic circuitry 300 detects any of those combinations. One skilled in the art will readily recognize that many different logic circuits can be designed to perform the same function as the logic circuitry 300. For example, well known gate transformations result in different but logically equivalent circuits.

The circuitry 200 in combination with the logic circuitry 300 is capable of detecting every multihit, not just even multihits. Furthermore, the circuitry 200 and the logic circuitry 300 together introduce only four gate delays from the input signal lines D0:D7 to the output MULTIHIT. The circuitry 200 accounts for one unit of delay; the inverters 312–332 account for another unit of delay; the NAND gates 336–344 introduce one more unit of delay; and finally the NAND gate 348 introduces one unit of delay.

Although the circuitry 200 and the logic circuitry 300 are shown as operating upon eight input signal lines, this is largely arbitrary. One skilled in the art will readily appreciate that the basic pattern of circuitry can be scaled to 16, 32 or higher powers of two input signal lines. For example, when 16 input signal lines are processed, an additional pair of intermediate signal lines is necessary (i.e., NE3 and E3) and an array of four columns of 16 switching devices is necessary. The intermediate signal lines can connect via the switching devices to the input signal lines according to the same pattern in the following sense: (1) NE3 would connect to the top eight input signal lines while E3 would connect to the bottom eight; (2) NE2 and E2 would each connect to alternating sets of consecutive four input signal lines; (3) NE1 and E1 would each connect to alternating sets of consecutive two input signal lines; and (4) NE0 and E0 would each connect to every other input signal line. In the case where the number of input signal lines is less than a power of two and a power of two circuit structure is utilized, the extra input signal lines can be fixed to a non-hot (e.g., low) state. Alternatively, a circuit structure directly accepting a non-power-of-two number of input signal lines can be utilized.

In general, the method works for all values of M from 2 bits up to T bits, where T is the maximum limit for the hardware technology, such as the maximum width of a wired-OR circuit. For example, if the hardware technology limits the width of a wired-OR circuit to be no more than 32 bits, and the input bits are encoded into two groups of $\log_2 M$ bits where the second group is the complement encoding of the first group, then M can be any number such that $2 \leq M \leq 64$. The maximum is 64 bits in this illustrative example because each bit in the two encoded groups connects to 32 switching devices, and the technology limit of a wired OR gate is 32 bits.

Figure 4A:
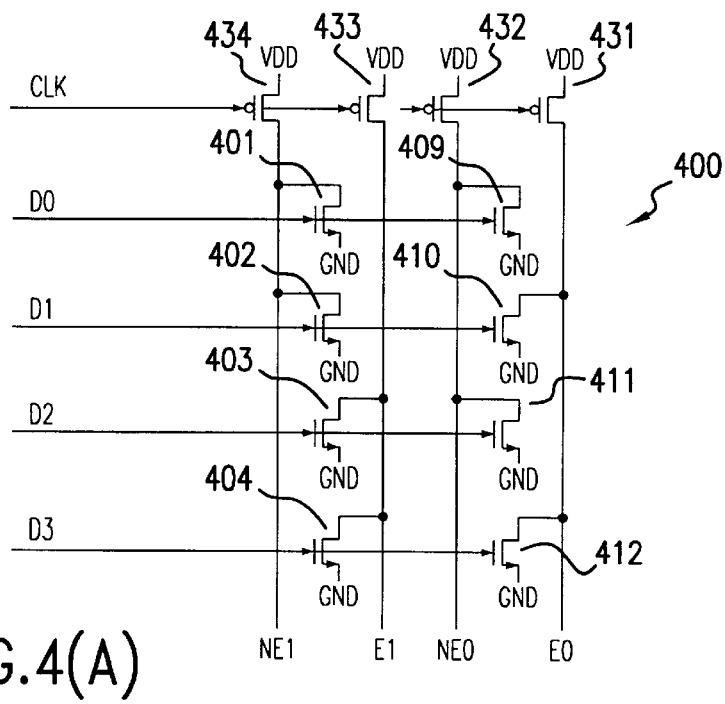
FIG. 4 is a schematic diagram of circuitry for use in detecting errors in one-hot words according to another embodiment of the invention.
Figure 4B:
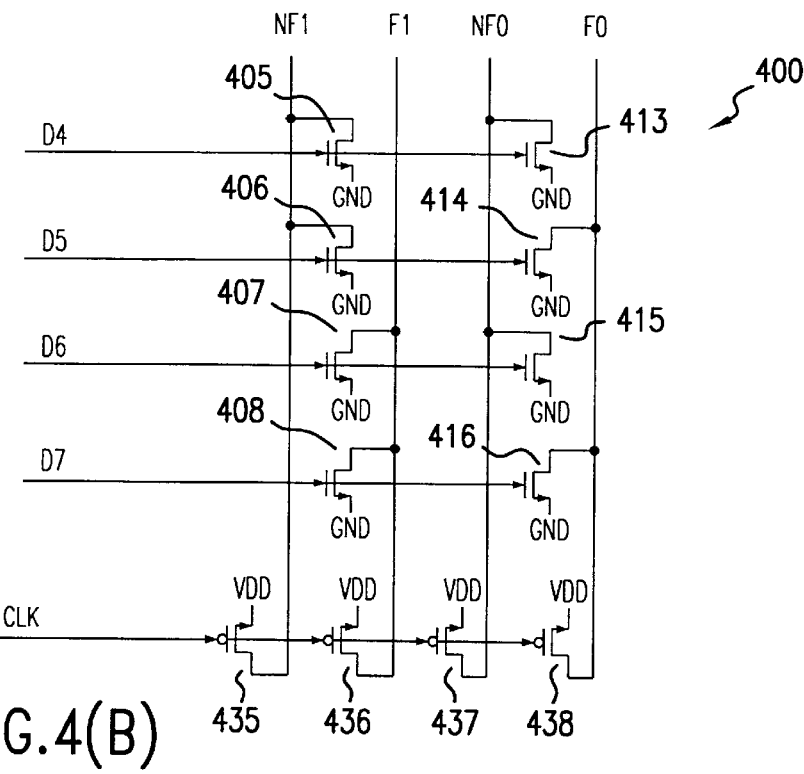
Figure 5:
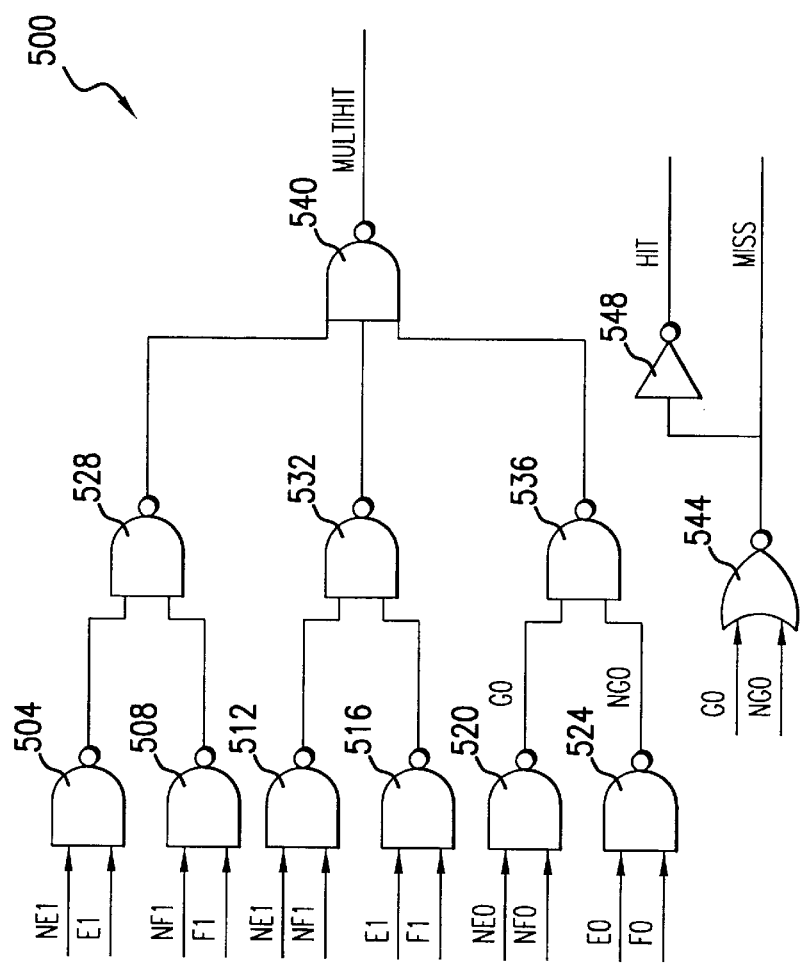
FIG. 5 is a diagram of logic circuitry for use in detecting errors in one-hot words according to another embodiment of the invention.

FIGS. 4 and 5 depict another embodiment of the invention. FIGS. 4(A) and 4(B) illustrate circuitry 400. FIG. 5 illustrates logic circuitry 500. The embodiment illustrated in FIGS. 4 and 5 is, in some sense, a optimization of the embodiment illustrated in FIGS. 2 and 3. As in FIG. 2, the input signal lines D0:D7 in FIG. 4 are input from the left and connected to switching devices 401–416. Also, a clock signal CLK is connected to PFETs 431–438 in a precharging arrangement. Intermediate signal lines NE0, E0, NE1, E1, F0, NF0, F1 and NF1 are selectively connected to the switching devices 401–416 and input to NAND gates 504–540 to produce a signal MULTIHIT and to a NOR gate 544, which is coupled to an inverter 548, to produce signals HIT and MISS. One skilled in the art can easily verify that the signals MULTIHIT, HIT and MISS output from the logic circuitry 500 are equivalent to the same signals output from the logic circuitry 300. In particular, the signal HIT is high if any one or more bits in D0:D7 are set. The signal MULTIHIT will be high if and only if two or more of the group of input bits D0:D7 are high. Compared to FIGS. 2 and 3, the arrangement of FIGS. 4 and 5 has certain desirable properties. For example, the input load is less for the circuitry 400. Also, the second embodiment can be implemented physically in a multilevel circuit with fewer vertical wire tracks when the logical circuitry 500 is located in an intermediate area between the portion of the circuitry 400 shown in FIG. 4(A) on one side and the portion of the circuitry 400 shown in FIG. 4(B) on the other side.

The circuitry 200 and the logic circuitry 300 taken together or the circuitry 400 and the logic circuitry 500 taken together are physical implementations of a method for detecting non-one-hot conditions in a group of M bits generally. The method may be implemented in hardware, software or firmware, for example. The method preferably encodes the group of M bits into two groups of encoded bits. Each group contains at least $\log_2 M$ (such as the next larger integer above $\log_2 M$) encoded bits. The encoding is such that each one-hot condition in the group of M bits generates a unique condition in the encoded bits. Continuing with the example, the 8 bits D0:D7 are encoded into two groups of three, where the second group of encoded bits are the complement encoding of the first group of encoded bits. Referring back to the circuitry 200, the first group of encoded bits corresponds to the intermediate signal lines E0, E1 and E2. The second group of encoded bits corresponds to the intermediate signal lines NE0, NE1 and NE2. The method determines on the basis of the encoded bits whether the group of M bits are in a non-one-hot condition. This determination step is performed by the logic circuitry 300, for example.

If M is not a power of two, the method can augment the M bits with L non-hot bits to form a group of N bits, where $N=M+L$ and N is a power of two. For example, if only the five bits D0:D4 are to be tested for a one-hot condition, then the input signal lines D5, D6, and D7 are tied to a non-hot state (e.g., low) in FIG. 2. In terms of the method for this example, $M=5$ and $L=3$, so that their sum, N, is a power of two ($N=8=2^3$). The method then continues, as described above, with N input bits instead of M bits. Alternatively, the method can operate directly on a number of bits that is not a power of two.

In another embodiment, the method generally operates on a group D of bits—for example, the eight bit set of input signal lines D0, D1, ..., D7—to determine if the group D has been corrupted by errors from its nominal one-hot (or possibly miss) condition. The method partitions D into two non-intersecting subsets, which can be denoted S0 and NS0. In the logic circuitry 200, for example, S0 is the set of input signal lines connected to the intermediate signal line NE0 via switching devices. That is, S0={D0, D1, D2, D3}. Likewise, NS0 is the set of input signal lines connected to the intermediate signal line E0 via switching devices, or {D4, D5, D6, D7}. D=S0∪NS0. The method determines whether any one or more bits in S0 is hot, and also determines whether any one or more bits in NS0 are hot. The method also partitions D in another way into non-intersecting subsets S1 and NS1. For example, S1={D0, D1, D4, D5} and NS1={D2, D3, D6, D7}, as the connections to the intermediate signal lines NE1 and E1, respectively, in the circuitry 200. Note that none of S0, NS0, S1, and NS1 are the same subsets. The method determines whether any one or more bits in S1 is hot, and also determines whether any one or more bits in NS1 are hot. The method may continue to form partitions of D as necessary depending upon the size of the group D, each time determining whether one or more bits are hot in each of the pair of subsets of the partition. For example, the circuitry 200 partitions D into S2={D0, D2, D4, D6} and NS2={D1, D3, D5, D7} by connections to the intermediate signal line NE2 and E2. On the basis of the determinations of whether any bits are hot in the subsets, the method can determine whether there is a multihit in the group D of bits, as described above. The particular subsets S0, NS0, S1, NS1, S2 and NS2 are. illustrative. Different subsets are possible. Specifically, any set of subsets that are jointly in one-to-one correspondence with the subsets S0, NS0, S1, NS1, S2 and NS2 would suffice. Put another way, any bijective mapping applied jointly to the subsets S0, NS0, S1, NS1, S2 and NS2 would produce a suitable set of subsets.

Variations of the methods are possible, just as variations of the apparatus are possible. For example, the apparatus embodiment depicted in FIGS. 4 and 5 taken together are physical implementations of a variation of the method described above. Basically, this variation divides a group DD of bits into two non-intersecting subsets (e.g., a first subgroup G1=D0:D3 and a second subgroup G2=D4:D7), performs the first method described above on each subset, and then logically combines the results. From this perspective, FIG. 4(A) can be seen as performing the portion of the method for the subset D0:D3 of the group DD=D0:D7, and FIG. 4(B) can be seen as performing the portion of the method for the subset D4:D7.

Figure 6:
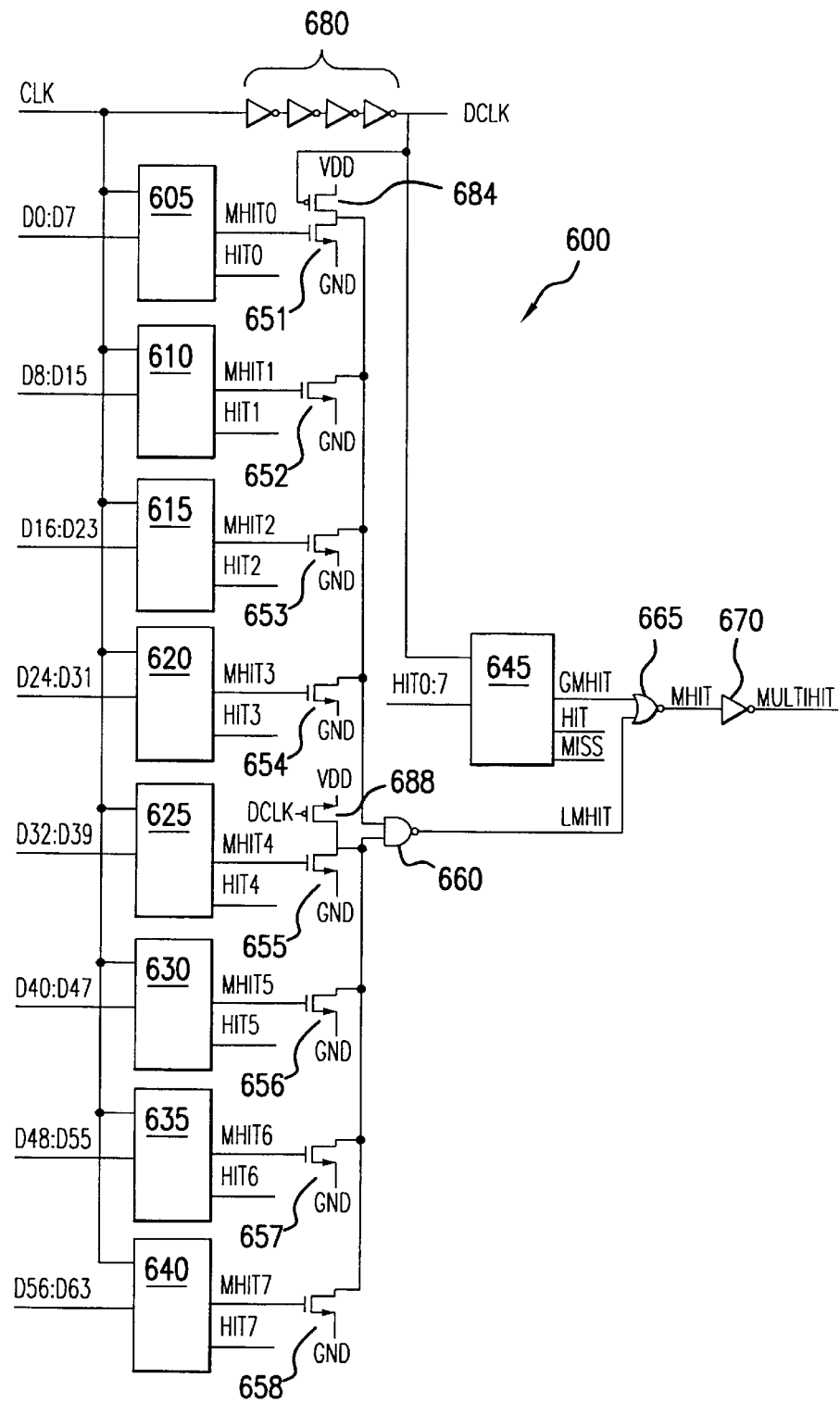
FIG. 6 is a diagram of a cascaded one-hot error detector.

FIG. 6 is a cascaded one-hot error detector 600, having as its modular building blocks the combination depicted in FIGS. 4 and 5. In particular, each of subdetectors 605–640 is a combination of the circuitry 400 and the logic circuitry 500. The subdetector 645 is likewise the same. In the error detector 600, a 64 bit one-hot word is processed to detect a corruption from its nominal one-hot state. The group of 64 bits is processed eight bits at a time by each of the subdetectors 605–640. The outputs HIT0, HIT1, . . . , HIT7 from the subdetectors 604–640 are input to the subdetector 645 as the eight bit input data word, as shown. Furthermore, multihit signals MHIT0, MHIT1, . . . , MHIT7 output from the subdetectors 605–640 are logically combined by NFETs 651–658, a NAND gate 660, a NOR gate 665, and an inverter 670, so as to produce a signal MULTIHIT, as shown. The signal MULTIHIT output from the error detector 600 is high if any MHIT signal from any of the subdetectors 605–640 is high or if HIT signals from two or more of the subdetectors 605 or 640 are high, thus causing a signal GMHIT output from the subdetector 645 to go high. In either case, multihits, no matter where the two or more set bits are within the 64 input bits, are detected by the error detector 600.

In a similar manner, a one-hot error detector can be constructed for any arbitrary word size following the pattern shown in FIG. 6. For example, a 128 bit one-hot error detector can be constructed by replicating the error detector 600 twice and suitably combining their outputs, and, in such a case, the total propagation delay of the wider error detector is increased only slightly (e.g., by one or two gate delays). Alternatively, a larger one-hot error detector can be constructed by increasing the size or input width of each subdetector 605–640, as described above. For example, using 16 bit subdetectors in place of the 8 bit subdetectors 605–640 would result in a 128 bit one-hot error detector.

The terms and descriptions used herein are set forth by way of illustration only and are not meant as limitations. Those skilled in the art will recognize that many variations are possible within the spirit and scope of the invention as defined in the following claims, and their equivalents, in which all terms are to be understood in their broadest possible sense unless otherwise indicated.

What is claimed is:

1. A method for detecting non-one-hot conditions in a group of M bits, the method comprising:
   encoding the group of M bits into a group of at least 2 $\log_2 M$ encoded bits, such that each one-hot condition in the group of M bits generates a unique condition in the group of encoded bits;
   determining on the basis of the encoded bits whether the group of M bits are in a non-one-hot condition;
   if M is not a power of two, then augmenting the M bits with L non-hot bits to form a group of M+L bits where M+L is a power of two; and
   performing the encoding step using the augmented group of M+L bits in place of the group of M bits.

2. The method of claim 1 wherein M is a power of two.

3. The method of claim 1 wherein the group of at least 2·$\log_2 M$ encoded bits consists of two groups, each of the two groups having at least $\log_2 M$ encoded bits.

4. The method of claim 3 wherein the group of at least 2·$\log_2 M$ encoded bits consists of pairs of encoded bits, and for each pair of encoded bits, one of each respective pair of encoded bits is based on a respective half of the M bits, and the other of each respective pair of encoded bits is based on the other respective half of the M bits.

5. The method of claim 1 wherein a hot bit is high and a non-hot bit is low.

6. The method of claim 1 further comprising:
   partitioning a group DD of bits into two non-intersecting subgroups G1 and G2;
   performing the encoding and determining steps where G1 is the group of M bits;
   performing the encoding and determining steps where G2 is the group of M bits;
   determining, on the basis of the results of the determining steps, whether the group DD of bits is in a non-one-hot condition.

7. A method for detecting one-hot errors in a group of bits, comprising:
   (a) partitioning a group D of bits into two non-intersecting subsets S0 and NS0 such that D=S0∪NS0;
   (b) determining whether any of the bits in S0 are hot;
   (c) determining whether any of the bits in NS0 are hot;
   (d) partitioning the group D into two non-intersecting subsets S1 and NS1 such that D=S1∪NS1, and none of S0, NS0, S1 and NS1 are the same;
   (e) determining whether any of the bits in S1 are hot;
   (f) determining whether any of the bits in NS1 are hot; and
   (g) determining whether the group D contains an error, on the basis of the results of the other determining steps;
   (h) partitioning the group D into two non-intersecting subsets S2 and NS2 such that D=S2∪NS2, and none of S0, NS0, S1, NS1, S2 and NS2 are the same;
   (i) determining whether any of the bits in S2 are hot;
   (j) determining whether any of the bits in NS2 are hot; and
   wherein the step (g) comprises determining whether any one of the following three conditions is true:
   the results of both steps (b) and (c) are affirmative,
   the results of both steps (e) and (f) are affirmative, and
   the results of both steps (i) and (j) are affirmative.

8. The method of claim 7 wherein the bits of the group D are denoted D0, D1, D2, D3, D4, D5, D6, and D7; and S0, S1 and S2 are any bijective mapping applied jointly to the sets {D0, D1, D2, D3}, {D0, D1, D4, D5} and {D0, D2, D4, D6}, respectively.

* * * * *